(12) United States Patent
Pham et al.

(10) Patent No.: US 7,215,784 B1
(45) Date of Patent: May 8, 2007

(54) PROGRAMMABLE AUDIO SYSTEM FOR AUTOMOTIVE VEHICLES

(75) Inventors: Linh N. Pham, Kokomo, IN (US); Larry D. Lechlitner, Kokomo, IN (US); Tom V. Cornell, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 811 days.

(21) Appl. No.: 10/021,920

(22) Filed: Dec. 13, 2001

(51) Int. Cl.
*H04B 1/00* (2006.01)
*H03G 5/00* (2006.01)

(52) U.S. Cl. .................. 381/86; 381/103; 455/345

(58) Field of Classification Search ................ 381/86, 381/103, 104, 107, 109, 389; 455/345
See application file for complete search history.

(56) References Cited

U.S. PATENT DOCUMENTS

| | | | |
|---|---|---|---|
| 4,947,431 A | 8/1990 | Stroud et al. | |
| 5,661,811 A | 8/1997 | Huemann et al. | |
| 5,940,518 A * | 8/1999 | Augustyn et al. | 381/59 |
| 5,983,087 A * | 11/1999 | Milne et al. | 455/149 |
| 6,288,634 B1 | 9/2001 | Weiss et al. | |
| 6,341,166 B1 * | 1/2002 | Basel | 381/103 |
| 6,346,876 B1 * | 2/2002 | Flick | 340/426.13 |

* cited by examiner

*Primary Examiner*—Xu Mei
(74) *Attorney, Agent, or Firm*—Jimmy L. Funke

(57) ABSTRACT

A system and method is disclosed for improving the audible output of a vehicle radio based upon the particular type of vehicle in which the radio is installed. A vehicle radio includes a data table, which is accessible by a radio controller. The data table stores a plurality of unique sets of alignment parameters. Each set of alignment parameters corresponds to a vehicle model in which the radio may be installed. The alignment settings are used to adjust various signal-processing techniques—such as "blend", "roll-off", "noise blank", etc.—as well as other parameters. The radio controller receives information indicative of the type of vehicle in which the radio is installed. The radio controller accesses the data table and applies the alignment settings that correspond to the type of vehicle. Listener-specific preferences can also be stored in the data table. The vehicle identification information can be provided to the radio controller through a variety of mechanisms, including an external vehicle diagnostic device, an internal vehicle body controller, or a radio face place.

15 Claims, 1 Drawing Sheet

PROGRAMMABLE AUDIO SYSTEM FOR AUTOMOTIVE VEHICLES

BACKGROUND OF THE INVENTION

1. Technical Field

The present invention relates generally to the field of audio systems for automotive vehicles, and, more specifically, to a programmable audio system wherein various signal processing settings in the radio receiver of the audio system can be customized to the particular vehicle in which the audio system is installed.

2. Background of the Invention

Virtually all modern automotive vehicles include an audio system that incorporates a radio receiver. A primary function of a radio receiver is to receive (through an antenna) radio signals transmitted over the airwaves, and then process and transform those radio signals into audio signals that can be provided to speakers, which in turn convert the audio signals into audible sounds. The nature of the audio signals provided by the receiver to the speakers determines, in large part, the audible sound output from the speakers. It is desirable for the radio receiver to optimize the audio signal so that the speakers produce the best possible audible sound.

Various well-known signal-processing techniques are applied to process and optimize the radio signal received by the receiver. For example, receivers typically employ a "blend" process to the input signal. "Blending" involves evaluating the strength of the radio signal received by the receiver and converting the audio signal supplied to the speakers from a stereo signal to a mono signal when the strength of the radio signal is relatively weak, which may occur when driving under a bridge, for example. After a given time constant, the receiver causes the audio signal to return to stereo. Receivers also typically employ a "roll-off" process to the radio signal, which involves phasing out higher frequencies in the radio signal so as to reduce the amount of undesirable noise produced by the speakers. Receivers also typically include a "noise blanker" process, which reduces the amount of noise/interference in the radio signal resulting from various vehicle noises, such as engine noise and stray reflections and signals. Several other signal-processing techniques are commonly employed by radio receivers to optimize the audio signal output to the speakers.

To achieve optimal audible sound from the vehicle audio system, it is desirable that the various signal-processing techniques of the receiver be adjusted to match the characteristics of the vehicle in which the radio receiver is installed. This is because many different vehicle-specific factors can affect the nature and quality of the radio signal received by the radio receiver and ultimately the quality of the audible sound produced by the speakers. Depending on these vehicle-specific characteristics, different degrees of "blending", "roll-off", "noise blanking", and other signal-processing techniques may be desirable. For example, the shape of the vehicle body and the particular engine used in the vehicle may affect the quality of the radio signal received by the receiver. Similarly, the shape of the interior passenger compartment and the number and placement of speakers therein affect the quality of the audible sound heard by a passenger. Furthermore, person-specific listening preferences affect the perceived quality of the audible sound produced by the speakers. For instance, younger people tend to prefer to listen to higher frequency signals, whereas older people tend to prefer that the higher frequency signals be filtered out. As a result of these vehicle-specific characteristics and person-specific preferences, different degrees of "noise-blanking, "blending", "roll-off", and other signal-processing techniques may be desirable.

It is common to install the same radio receiver model in many different types of vehicles, each having different vehicle-specific characteristics that affect the quality of the audible sound produced by the audio system. Therefore, in an attempt to optimize the audible sound produced by the speakers, it is known to modify the various signal-processing algorithms in radio receivers during manufacture of the radio receiver to complement the particular vehicle in which the receiver is to be installed. Under this method, because the signal-processing techniques of radio receivers are optimized for each type of vehicle, each vehicle model may have a slightly different radio receiver associated with it, even though the same basic kind of radio receiver is installed in several vehicle models. The process of manufacturing several different versions of the same basic radio receiver results in an undesirable inventory of multiple part numbers. Therefore, this is a logistically-difficult and expensive solution to optimizing audio systems.

As a result, it is common to manufacture radio receivers used in different vehicle models such that their signal-processing algorithms are adjusted to complement the "average" characteristics of the various vehicles into which the receiver is to be installed. Thus, the radio receivers, while performing adequately for the various vehicle models, are not optimized for any particular vehicle model.

The inventors have recognized that the practice of optimizing radio receivers for the "average" vehicle characteristics across many different vehicle models, each having different vehicle-specific audio characteristics, does not produce optimal audio response for any of the vehicles. Instead, it is desirable to be able to optimize the signal-processing algorithms of radio receivers to complement the specific vehicle characteristics of the particular vehicle in which it is installed. Furthermore, the inventors have recognized that the known methods of optimizing the signal-processing algorithms do not provide for the ability to adjust the signal-processing algorithms after the radio receiver is installed in a vehicle to account for listener-specific listening preferences. Therefore, the inventors have recognized the need for a new system and method for optimizing the quality of radio signals for different vehicles that address the shortcomings of the prior art.

SUMMARY OF THE INVENTION

The present invention relates to a programmable vehicle audio system, wherein various signal-processing algorithms of the radio receiver can be adjusted and customized to complement a particular vehicle after the radio receiver is manufactured. Specifically, the various signal-processing algorithms of the present programmable radio receiver can be adjusted during the assembly process of the vehicle, by a vehicle dealer/service center after the vehicle has been completely assembled, or even by the vehicle owner after the vehicle has been sold.

The present invention comprises a radio having a radio controller—typically a microprocessor—contained therein. The radio controller is capable of accessing a data table stored in the radio. The data table is capable of storing unique sets of alignment parameters, wherein each set of alignment parameters correspond to a different vehicle model. The alignment parameters are used by the radio controller to adjust the various signal processing techniques used by the radio to process the radio signals. Vehicle identification information is provided to the radio controller, and, based upon the vehicle identification information, the controller accesses the appropriate alignment parameters from the data table and uses those alignment parameters to affect the output of the radio. The vehicle identification information can be supplied to the radio controller from a variety of different sources, including an external vehicle diagnostic device, an internal vehicle body controller, or a radio face plate.

BRIEF DESCRIPTION OF THE DRAWINGS

The present invention will now be described, by way of example, with reference to the accompanying drawing, in which.

DETAILED DESCRIPTION OF A PREFERRED EMBODIMENT

Figure 1:
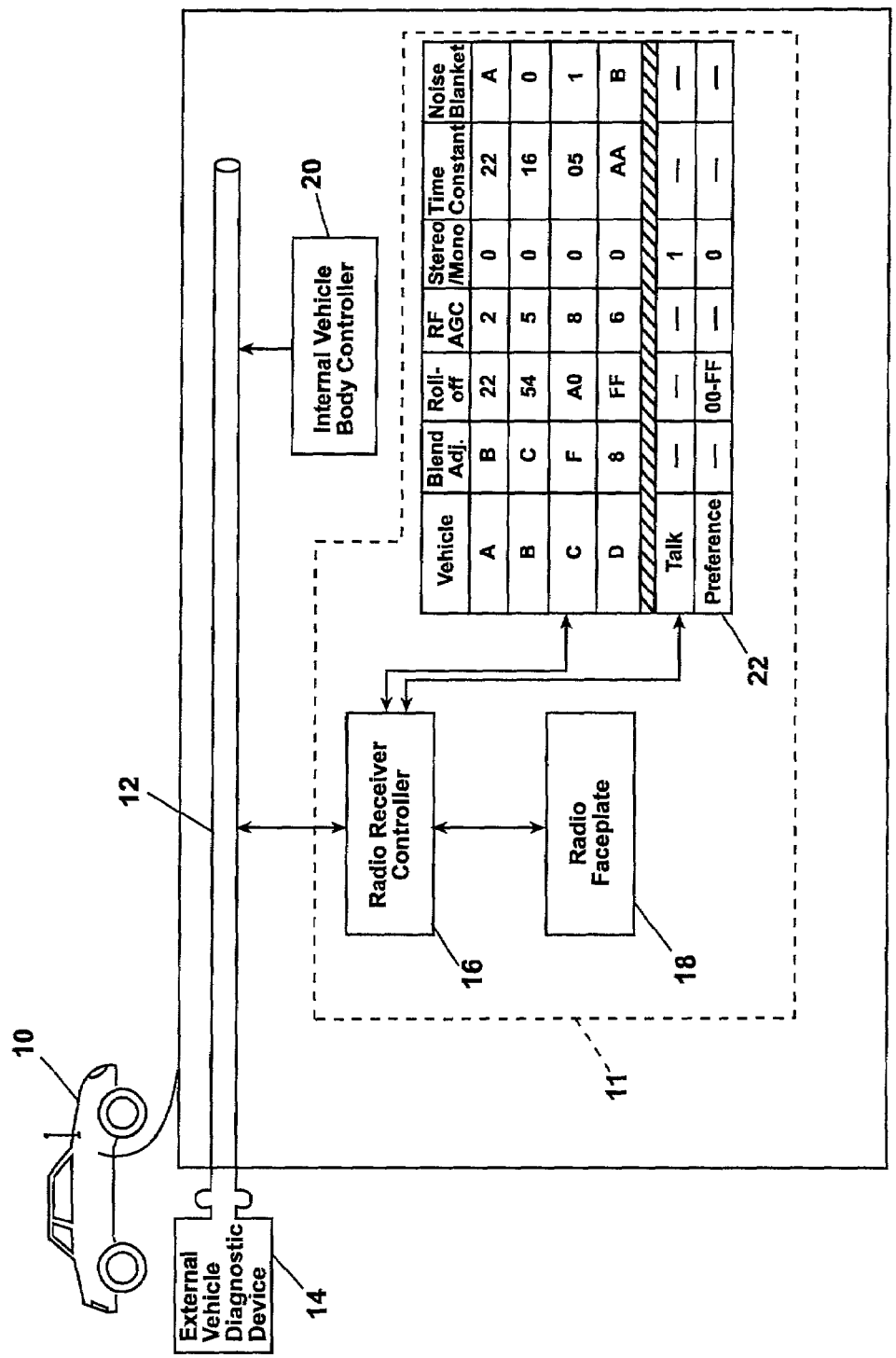
FIG. 1 is a functional illustration of an embodiment of the present invention.

FIG. 1 sets forth an embodiment of the present invention. An automotive vehicle 10 includes a radio 11. The radio 11 includes a radio receiver controller 16 that communicates with a radio faceplate 18 and a vehicle central data bus 12. The radio controller 16, which is typically a microprocessor, generally controls the operation of the radio 11. The radio faceplate 18 provides a human-readable interface to the vehicle operator and also allows the vehicle operator to provide information to the radio, such as the selected radio station. The central data bus 12, which provides a common path for data transfer throughout the vehicle 10, is in communication with an internal vehicle body controller 20. The internal vehicle body controller 20, which is typically a microprocessor, controls general operation of the vehicle 10. The central data bus 12 can be connected to an external vehicle diagnostic device 14 through a connector to allow two-way data transfer between the vehicle 10 and the external vehicle diagnostic device 14. A human operator can receive information from and transfer information to the vehicle 10 through the external vehicle diagnostic device 14.

According to one preferred embodiment of the invention, the radio controller 16 is in communication with a radio data table 22, which is stored in a memory device, such as an EPROM. The data table 22 contains radio-optimization information, i.e., alignment settings, specific to each type of vehicle into which the particular radio is to be installed. In the example set forth in FIG. 1, the sample data table 22 contains alignment settings relating to vehicle types "A", "B", "C" and "D", though the data table 22 can contain information corresponding to as many vehicles as desirable.

The data table 22 can contain default alignment settings for a variety of signal-processing techniques used in radio receivers. The alignment settings are specific to and optimized for the corresponding vehicle model. In the example set forth in FIG. 1, the data table 22 contains alignment settings for each vehicle model (i.e., vehicles "A", "B", "C", and "D") for the following common signal-processing techniques: (i) blend; (ii) roll-off; (iii) radio frequency automatic gain control (RF/AGC); and (iv) noise blanker. The sample data table 22 also contains default alignment settings for parameters "stereo/mono" and "time constant." As described above, the well-known "blend" process involves evaluating the radio signal strength received by the radio and changing the signal from stereo to mono when the signal is relatively weak. The "time constant" parameter refers to a time constant during which the signal is maintained in a mono format before it is returned to stereo. The "roll-off" process involves filtering out higher frequencies from the radio signal so as to reduce the amount of noise in the signal. The amount of desired "roll-off" is dependent upon the configuration of the vehicle, the type and number of speakers used in connection with the radio, and personal preference. The "RF/AGC" alignment parameter refers to the desired amount of gain or amplification to apply to the signal received by the radio. The amount of desired gain is dependent upon the type, configuration and pattern of the antenna used on the vehicle. For example, in-glass antennas have different desired gain requirements than external antennas. Finally, the "noise blanker" process involves a known signal-processing technique for filtering out noise introduced to the radio signal as a result of signal interference caused by the vehicle engine and other electrical components and devices, both internal and external to the vehicle. The selected signal-processing techniques and parameters (i.e., "blend", "roll-off" "RF/ AGC", "stereo/mono", "time constant", and "noise blanker") illustrated in FIG. 1 are set forth merely as examples, and a wide variety of vehicle-specific signal-processing techniques and parameters can be included in the data table 22.

The specific default alignment settings contained in the data table 22 (i.e., "22", "54", "A0", and "FF" for "roll-off") are determined according to known methods, including laboratory and field testing the vehicles and audio systems. The determined alignment settings are pre-programmed into the data table 22 at the time of manufacturing the radio. The sample default alignment settings illustrated in FIG. 1 are set forth as mere examples of possible settings, and any desired settings can be included in the data table 22.

In addition to alignment settings corresponding to the various vehicles in which the radio is installed, the data table 22 can also include radio optimization information that optimizes the audio response for various equalization modes and personal preferences. In FIG. 1, data table 22 includes a "TALK" row having a "1" recorded in the "stereo/mono" column. The "TALK" row relates to an equalization mode on the radio face place 18 that a vehicle operator may select when listening to a radio station that primarily includes talking, as opposed to music. The "1" in the "stereo/mono" column is a binary indicator that is interpreted by the radio controller 16 to cause the audible sound to be produced in mono (instead of stereo) when the vehicle operator selects "TALK" from the radio face place 18. Essentially, in this example, the default "stereo/mono" alignment setting is overridden when the equalizer is set to "TALK" mode. Other common equalizer modes can also be incorporated into the data table 22, such as "JAZZ", "ROCK", "COUNTRY", etc., and the various default alignment settings can be overridden when such equalizer modes are selected. For example, it may be desirable to adjust one or more of the default alignment settings for "blend", "roll-off", "RF/ AGC", etc. associated with the various vehicles when one of the various equalizer modes is selected by the vehicle operator.

The sample data table 22 illustrated in FIG. 1 also includes a row for "PREFERENCE", which includes the setting "00-FF" in the "roll-off" column and "0" in the "stereo/mono" column. The "PREFERENCE" row in the data table 22 can be included to allow modifications to the default alignment settings based upon the personal preferences of the vehicle operator. For example, if the primary vehicle operator prefers to listen to music that includes higher frequencies (irrespective of the fact that the overall signal may be relatively noisier), the preferred amount of roll-off can be adjusted downward. Similarly, if the primary vehicle operator prefers to filter out the higher frequencies to reduce the amount of noise in the signal, the preferred amount of roll-off can be adjusted upward. The values in the "PREFERENCE" row of the data table 22 override the default settings for a particular vehicle.

With the present invention, the same radio 11 can be installed in several different vehicle models, and, at the same time, the audible signal can be optimized for each specific vehicle and even the specific vehicle operator. In practice, a radio 11 is manufactured having a default data table 22 incorporated therein. The default data table 22 will normally include corresponding default alignment settings for a variety of signal-processing techniques and a variety of vehicles. As indicated, the specific alignment settings are determined according to known methods, including laboratory and field testing. After the radio is installed in a particular vehicle 10, a vehicle identification information is provided to the radio 11 so that the appropriate alignment settings can be read from the data table 22. The vehicle identification can be accomplished in several different ways. One method of vehicle identification is for the internal vehicle body controller 20, which itself typically stores a unique identification of the vehicle, to provide the vehicle identification over the data bus 12 to the radio receiver controller 16. An alternative method includes connecting an external vehicle diagnostic device 14 to the data bus 12 during the assembly of the vehicle and providing vehicle identification information from the external vehicle diagnostic device 14 over the data bus 12 to the radio controller 16. Finally, vehicle identification information could be provided through the radio face place 18 through an automated menu system, which could, for example, be enabled by pressing two selected buttons on the face plate simultaneously. Regardless of the method, it is preferable that the vehicle identification be made during assembly of the vehicle.

Once the vehicle identification information is provided to the radio controller 16, the radio controller can access the proper row of the data table 22 associated with the particular vehicle, and thereby employ the default alignment settings for that vehicle. For example, in FIG. 1, if the radio controller 16 receives a vehicle identification of "C", then the radio controller will employ an "F" setting for "blend", an "A0" setting for "roll-off", an "8" setting for "RF/AGC", a "0" setting for "stereo/mono", a "05" setting for "time constant", and a "1" setting for "noise blanker."

After the vehicle is assembled and sold, the alignment settings associated with the graphic equalizer modes (e.g., "TALK") and the "PREFERENCE" row of the data table 22 may be modified, if desired. Specifically, it is possible for a vehicle dealer/service center to adjust the degree of "roll-off" or "blend", for example, for a particular vehicle operator by adjusting the values in the "PREFERENCE" row of the data table 22. The "PREFERENCE" row values can be adjusted through an external vehicle diagnostic device 14 over the central data bus 12, or they can be adjusted through the radio face place 18, as described above.

A preferred embodiment of the present invention has been described hereinabove. However, a person skilled in the art will recognize that the present invention can be used in a variety of different forms. Therefore, the following claims should be studied to determine the true scope and content of the invention.

What is claimed is:

1. A vehicle audio system, comprising:
   a radio controller;
   a data table accessible by said radio controller, said data table capable of storing a unique set of default alignment settings for each of a plurality of vehicle models, wherein said data table is further capable of storing a unique set of preference alignment settings corresponding to personal listening preferences of a vehicle operator, said preference alignment settings being intended to override said default alignment settings; and
   a radio face plate in communication with said radio controller, said face plate providing a human readable/operable interface with said radio controller,
   wherein said radio controller is capable of receiving data indicative of a vehicle model from said radio face plate.

2. The vehicle audio system of claim 1, wherein each of said unique sets of default alignment settings comprise values associated with one or more of the following parameters: (i) blend; (ii) roll-off; (iii) radio frequency automatic gain control; (iv) stereo/mono; (v) time constant; and (vi) noise blanker.

3. The vehicle audio system of claim 1, wherein said data table is further capable of storing a unique set of equalization alignment settings corresponding to at least one equalization mode, said equalization alignment settings being intended to override said default alignment settings when the audio system is operating in said equalization mode.

4. The vehicle audio system of claim 3, wherein said equalization mode corresponds to operation of the audio system such that the primary output is talk.

5. The vehicle audio system of claim 1, wherein said radio controller causes audio signals to be produced based upon said default alignment settings.

6. The vehicle audio system of claim 1, wherein said controller causes audio signals to be produced based upon said set of default alignment settings corresponding to said vehicle model.

7. The vehicle audio system of claim 1, wherein said radio controller causes audio signals to be produced based upon said set of default alignment settings corresponding to said vehicle model.

8. The vehicle audio system of claim 1, wherein said radio controller causes audio signals to be produced based upon said set of default alignment settings corresponding to said vehicle model.

9. The vehicle audio system of claim 1, wherein said radio controller causes audio signals to be produced based upon said set of default alignment settings corresponding to said vehicle model.

10. An audio system for installation in a vehicle, comprising:
    a radio controller;
    a data table accessible by said radio controller, said data table capable of storing a unique set of default alignment settings for each of a plurality of vehicle models, wherein said data access table is further capable of sorting a unique set of preference alignment settings corresponding to personal listening preferences of the vehicle operator, said preference alignment settings used to override said default alignment settings; and
    a means for identifying said vehicle model in which the audio system is installed,
    wherein said radio controller is adapted to cause audio signals to be produced based upon at least one of said settings in said unique set of default alignment settings or at least one of said settings in said unique set of preference alignment settings, and
    wherein said means for identifying said vehicle model comprises a radio face plate in communication with said radio controller, said face plate providing a human readable/operable interface with said audio system.

11. A method of programming a vehicle radio, comprising:
- identifying a type of vehicle in which the radio is installed;
- accessing at least one default alignment setting corresponding to said type of vehicle in which the radio is installed, said default alignment setting being stored in the radio; and
- using said default alignment setting to affect an audible sound produced by the radio,
- wherein said step of identifying a type of vehicle in which the radio is installed comprises communicating vehicle identification information from an internal vehicle body controller to a radio controller,
- wherein said internal vehicle body controller controls the general operation of the vehicle.

12. The method of claim 11, wherein said step of accessing at least one default alignment setting comprises accessing a data table, said data table being capable of storing a unique set of default alignment settings for each of a plurality of vehicle models.

13. The method of claim 11, wherein said step of identifying a type of vehicle in which the radio is installed comprises communicating vehicle identification information from an external vehicle diagnostic device to a radio controller.

14. The method of claim 11, wherein said step of identifying a type of vehicle in which the radio is installed comprises communicating vehicle identification information from a radio face plate to a radio controller.

15. The method of claim 11, wherein said step of using said default alignment setting to affect an audible sound produced by the radio comprises adjusting at least one signal-processing technique applied to radio signals received by the radio.

* * * * *